United States Patent
Berard et al.

(10) Patent No.: US 10,475,600 B2
(45) Date of Patent: Nov. 12, 2019

(54) BREAKER DEVICE FOR INTERRUPTING CURRENT ON A TRANSMISSION LINE

(71) Applicant: Alstom Technology Ltd., Baden (CH)

(72) Inventors: David Berard, Villeurbanne (FR); Yang Yang, Villeurbanne (FR)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 276 days.

(21) Appl. No.: 15/327,557

(22) PCT Filed: Jul. 22, 2015

(86) PCT No.: PCT/EP2015/066713
§ 371 (c)(1),
(2) Date: Jan. 19, 2017

(87) PCT Pub. No.: WO2016/012478
PCT Pub. Date: Jan. 28, 2016

(65) Prior Publication Data
US 2017/0178832 A1    Jun. 22, 2017

(30) Foreign Application Priority Data
Jul. 25, 2014 (EP) .................................. 14178544

(51) Int. Cl.
*H02H 3/08* (2006.01)
*H01H 9/54* (2006.01)
(Continued)

(52) U.S. Cl.
CPC ............ *H01H 9/548* (2013.01); *H02H 7/222* (2013.01); *H02H 9/005* (2013.01); *H02M 1/34* (2013.01);
(Continued)

(58) Field of Classification Search
USPC ...................................................... 361/2–13
See application file for complete search history.

(56) References Cited

U.S. PATENT DOCUMENTS 8,995,097 B2 * 3/2015 Skarby ................... H02H 3/087
361/2
9,373,473 B2 * 6/2016 Dupraz ................... H01H 9/542
(Continued)

FOREIGN PATENT DOCUMENTS

| CN | 103219699 A | 7/2013 |
| FR | 2 985 082 A1 | 6/2013 |
| WO | 2011/057675 A1 | 5/2011 |

OTHER PUBLICATIONS

Search Report issued in European Patent Application No. 14178544 dated Jan. 22, 2015.
(Continued)

*Primary Examiner* — Danny Nguyen
(74) *Attorney, Agent, or Firm* — Eversheds Sutherland (US) LLP

(57) ABSTRACT

A breaker device for interrupting current flowing on a transmission line, the device comprising three electrical branches ($B_1$, $B_2$, $B_3$) connected in parallel, including a main branch ($B_1$) in which the current to be interrupted flows and an auxiliary branch ($B_2$), the main branch comprising at least one semi-conductor breaker cell ($CEL_1$) connected in series with at least one mechanical interrupter/disconnector ($S_m$), the auxiliary branch ($B_2$) comprising at least one thyristor, the breaker device further comprising a control circuit (CM) suitable for interrupting a current that flows in the main branch. Once the current is interrupted in the semi-conductor element of the breaker cell of the main branch, the control circuit acts to command the thyristor of the auxiliary branch ($B_2$) to be put into a conductive state whenever a current
(Continued)

flowing in the voltage limiter(s) reaches the value of the current that is flowing in the transmission line.

18 Claims, 6 Drawing Sheets

(51) Int. Cl.
　　　H02H 7/22　　　(2006.01)
　　　H02M 1/34　　　(2007.01)
　　　H02H 9/00　　　(2006.01)
　　　H03K 17/567　　(2006.01)
　　　H03K 17/60　　 (2006.01)
　　　H02H 3/02　　　(2006.01)
　　　H02H 9/02　　　(2006.01)
(52) U.S. Cl.
　　　CPC ............ *H03K 17/567* (2013.01); *H03K 17/60* (2013.01); *H02H 3/025* (2013.01); *H02H 3/08* (2013.01); *H02H 9/02* (2013.01)

(56) References Cited

U.S. PATENT DOCUMENTS

| | | | |
|---|---|---|---|
| 2012/0299393 A1* | 11/2012 | Hafner | .................. H01H 9/542 |
| | | | 307/113 |
| 2014/0217833 A1 | 8/2014 | Rong | |
| 2015/0002977 A1 | 1/2015 | Dupraz | |
| 2015/0348718 A1 | 12/2015 | Aeschbach | |

OTHER PUBLICATIONS

International Search Report issued in Application No. PCT/EP2015/066713 dated Dec. 2, 2015.

Written Opinion issued in Application No. PCT/EP2015/066713 dated Dec. 2, 2015.

* cited by examiner

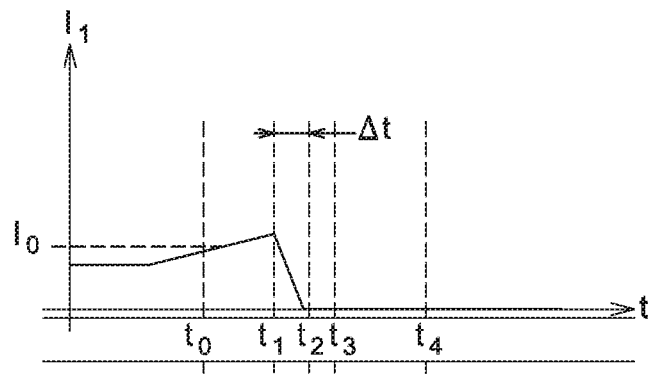
Fig. 5A
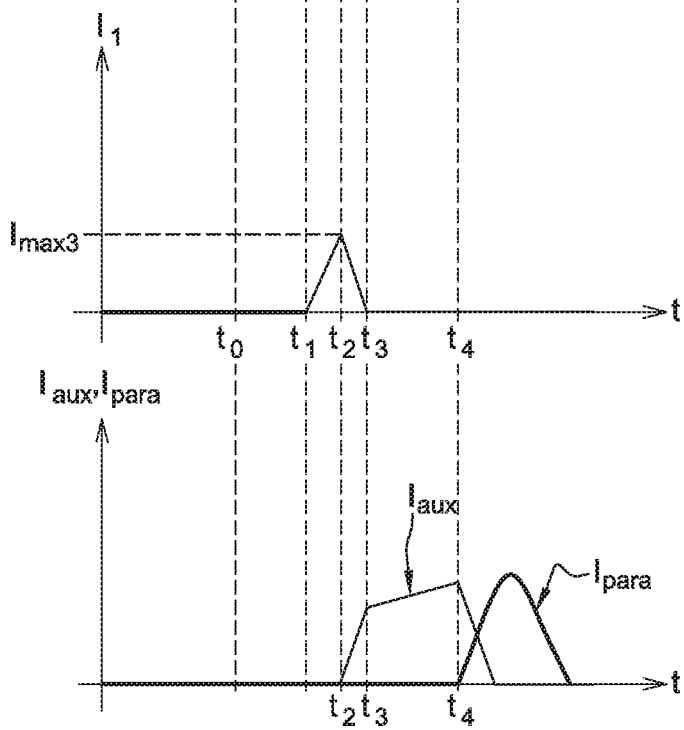
Fig. 5B
Fig. 5C

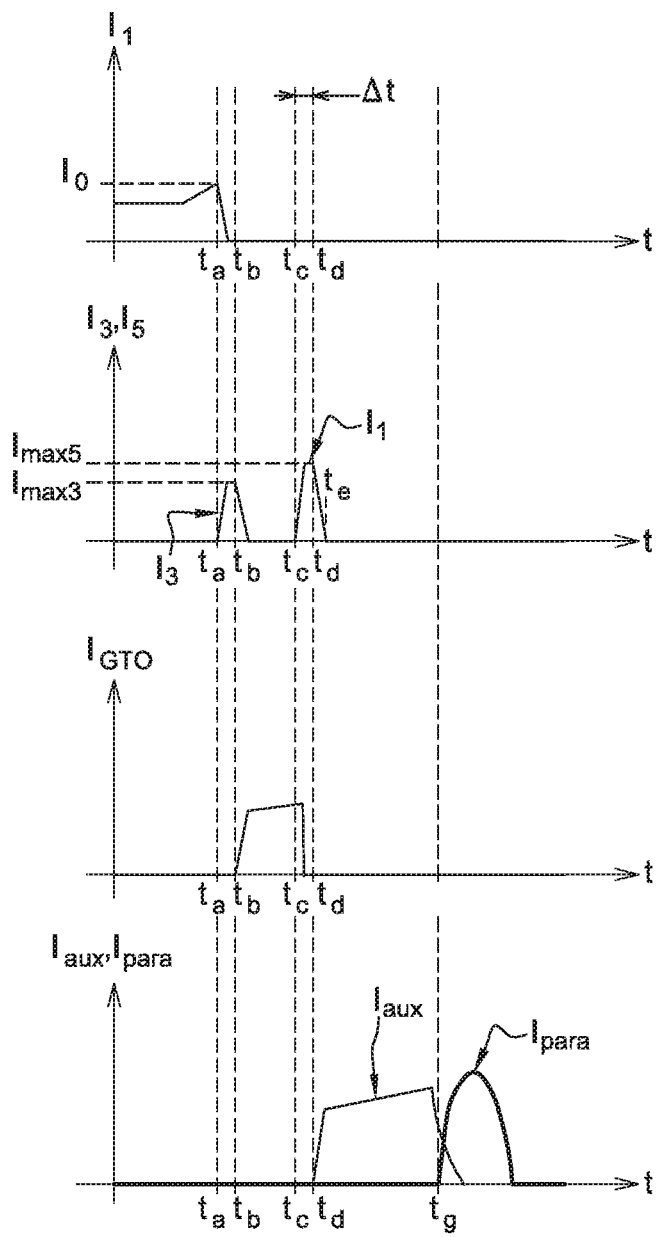

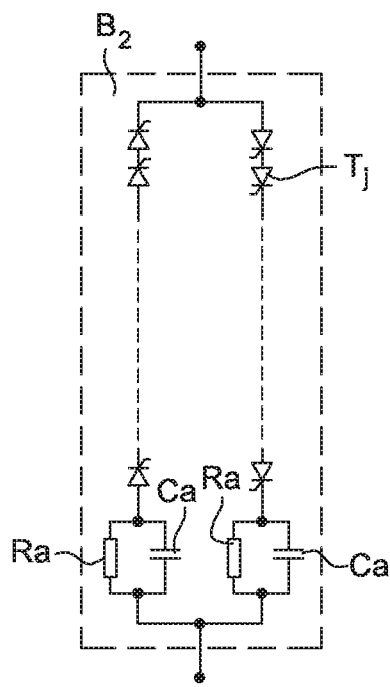
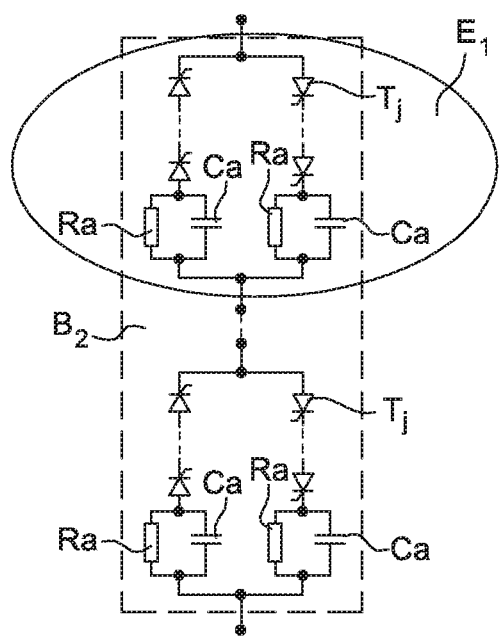
Fig. 8A  Fig. 8B
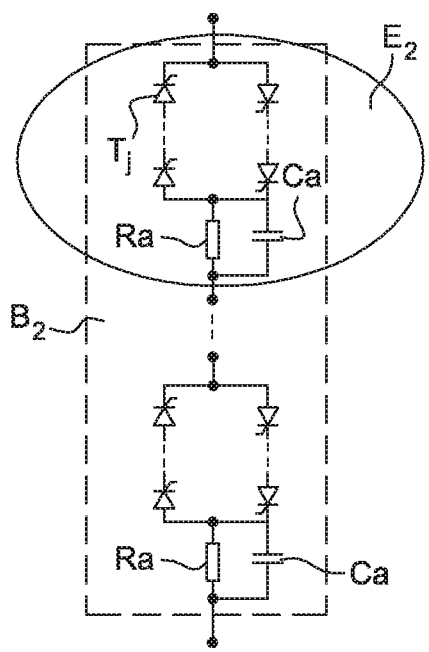
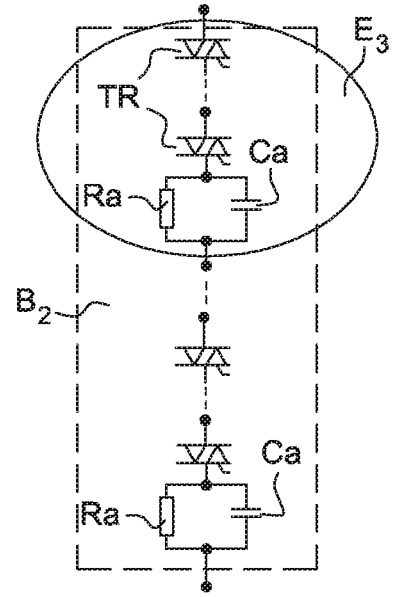
Fig. 8C  Fig. 8D

BREAKER DEVICE FOR INTERRUPTING CURRENT ON A TRANSMISSION LINE

TECHNICAL FIELD AND PRIOR ART

The invention relates to a breaker device for interrupting current on a transmission line.

The current that it is desired to interrupt is preferably a large direct current (DC) or alternating current (AC) that is present on high-voltage transmission and/or distribution lines, typically at voltages greater than 50 kilovolts (kVDC) (for DC) or 50 kilovolts root mean square (kVrms) (for AC). More generally, the invention also applies to interrupting current on transmission and/or distribution lines under voltages of smaller values than the values mentioned above. The breaking time for interrupting the current must be very brief, typically of the order of a few milliseconds.

On 23 Dec. 2011, the Applicant filed a French patent application under the national registration No. 2 985 082 and entitled «Dispositif disjoncteur mécatronique et procédé de déclenchement associé et application à la coupure de courant continu élevé».

Patent application FR 2 985 082 discloses a mechatronic circuit breaker device that is suitable for interrupting current that is flowing in electricity transmission means. The mechatronic circuit breaker device comprises three parallel branches, namely a main branch in which the current to be interrupted flows, an auxiliary branch, and a main voltage limiter, also known as a lightning arrester. The auxiliary branch itself includes, in parallel, at least one timer sub-branch and at least one arming sub-branch.

The presence of the timer sub-branch(es) results in an auxiliary branch having a large number of components. In addition, the electronic power components used in the timer sub-branch(es) are not standard components. It is necessary for the turn-off time of the components to be extremely short. This technical requirement results in using components that are expensive.

The invention does not present this drawback.

SUMMARY OF THE INVENTION

The invention relates to a breaker device for interrupting current flowing on a transmission line, the device comprising three electrical branches connected in parallel, namely: a main branch in which the current to be interrupted flows; an auxiliary branch; and a voltage limiter branch; the main branch comprising at least one semi-conductor breaker cell connected in series with at least one mechanical interrupter/disconnector, the semi-conductor breaker cell including at least one semi-conductor element that is suitable for being commanded to open or close and that is connected in parallel with a voltage limiter, the auxiliary branch comprising at least one assembly that is constituted by at least one capacitor connected in parallel with at least one resistor, said assembly being connected in series with at least one thyristor, the device further comprising control means that are suitable for commanding opening of the semi-conductor element of the semi-conductor breaker cell and opening of the mechanical interrupter/disconnector.

The control means further comprise means that are suitable for acting, once the current is interrupted in the semi-conductor element of the semi-conductor breaker cell, to command the thyristor of the auxiliary branch to be put into a conductive state at an instant that is after or at the instant at which the current flowing in the voltage limiter(s) reaches the value of the current that is flowing in the transmission line.

In a first embodiment of the invention, the control means comprise:
means that are suitable for applying an opening command to the mechanical interrupter/disconnector at an instant $t_0$;
means that are suitable for applying the opening command to the semi-conductor element of the semi-conductor breaker cell at an instant $t_1$ that is after the instant $t_0$, such that a current passing through said semi-conductor element decreases until it is zero, and such that a current passing through the voltage limiter (s) increases until it reaches the value of the current that is flowing in the transmission line; and
means that are suitable for applying a command for putting the thyristor of the auxiliary branch in a conductive state at an instant $t_2$ that is after or at the instant at which the current flowing in the voltage limiter(s) reaches the value of the current that is flowing in the transmission line.

In an improvement to the first embodiment of the invention, the device further comprises:
control means that are suitable for applying, at an instant that precedes the instant $t_0$, a preliminary opening command to the semi-conductor element of the breaker cell of the main branch;
means that are suitable, when the preliminary opening command is applied to the semi-conductor element of the breaker cell of the main branch, for measuring charge in the storage capacitors connected in parallel with the thyristor of the auxiliary branch; and
means that are suitable for allowing the opening command to be applied to the mechanical interrupter/disconnector at an instant $t_0$, if a measurement of the charge of the storage capacitors matches a predetermined charge value.

In a second embodiment of the invention, at least one additional semi-conductor breaker cell having breaking capacity that is greater than the breaking capacity of the semi-conductor breaker cell is placed in parallel with the semi-conductor breaker cell.

The term "breaking capacity" of a breaker cell is understood by the person skilled in the art to mean the capacity of the breaker cell to interrupt large currents. The greater the breaking capacity of a breaker cell, the greater the magnitude of the current that can be interrupted by the cell.

In a first variant of the second embodiment of the invention, the additional semi-conductor breaker cell includes at least one voltage limiter connected in parallel with the semi-conductor that it contains. The voltage limiter is dimensioned to pass a current that is equal to the current interrupted by the additional breaker cell.

In a second variant of the second embodiment of the invention, the second breaker cell does not include its own voltage limiter, and it is the voltage limiter(s) of the semi-conductor breaker cell that is/are dimensioned to pass a current that is equal to the current interrupted by the additional breaker cell.

In the second embodiment of the invention, the control means comprise:
means that are suitable for applying an opening command to the semi-conductor element of the semi-conductor breaker cell at an instant $t_a$;
means that are suitable for applying an opening command to the mechanical interrupter/disconnector and a closing command to the semi-conductor element of the additional semi-conductor breaker cell at an instant $t_b$ that is after the instant $t_a$, such that the semi-conductor element of the additional semi-conductor breaker cell becomes conductive;

means that are suitable for applying an opening command to the semi-conductor element of the additional semi-conductor breaker cell at an instant $t_c$ that is after the instant $t_b$, such that a current passing through the semi-conductor element of the additional semi-conductor breaker cell decreases until it is zero, and such that a current passing through the voltage limiter(s) increases until it reaches the value of the current that is flowing in the transmission line; and means that are suitable for applying a command for putting the thyristor of the auxiliary branch in a conductive state at an instant $t_d$ that is after or at the instant at which the current flowing in the voltage limiter(s) reaches the value of the current that is flowing in the transmission line.

In an improvement to the second embodiment of the invention, the control means comprise means that are suitable for applying a preliminary opening command to the semi-conductor element of the breaker cell of the main branch at the instant $t_a$, and the device further comprises:

means that act when the preliminary opening command is applied to the semi-conductor element of the breaker cell of the main branch to measure charge in storage capacitors connected in parallel with the thyristor of the auxiliary branch; and means that are suitable for allowing the opening command to be applied to the mechanical interrupter/disconnector, if a measurement of the charge of the storage capacitors matches a predetermined charge value.

The breaker device of the invention does not include a timer sub-branch. An advantage of the invention is to reduce the size and the cost of the breaker device and to increase its reliability.

The interrupted current flowing in the main branch may be the nominal current or some other current, e.g. a current that is greater than the nominal current and that results from the appearance of a fault in the electrical equipment to which the breaker device belongs.

BRIEF DESCRIPTION OF THE FIGURES

Other characteristics and advantages of the invention appear on reading the description given below with reference to the accompanying figures, in which:

FIGS. 5A-5C show the current-interrupting phenomenon as it occurs, as a function of time, in the circuits shown in FIGS. 1A-4;

FIGS. 7A-7D show the current-interrupting phenomenon as it occurs, as a function of time, in the circuit shown in FIG. 6; and FIGS. 8A-8D show, by way of non-limiting example, various auxiliary branch variants that are compatible with various embodiments of the invention.

In all of the figures, like references designate like elements.

DETAILED DESCRIPTION OF EMBODIMENTS OF THE INVENTION

Figure 1A:
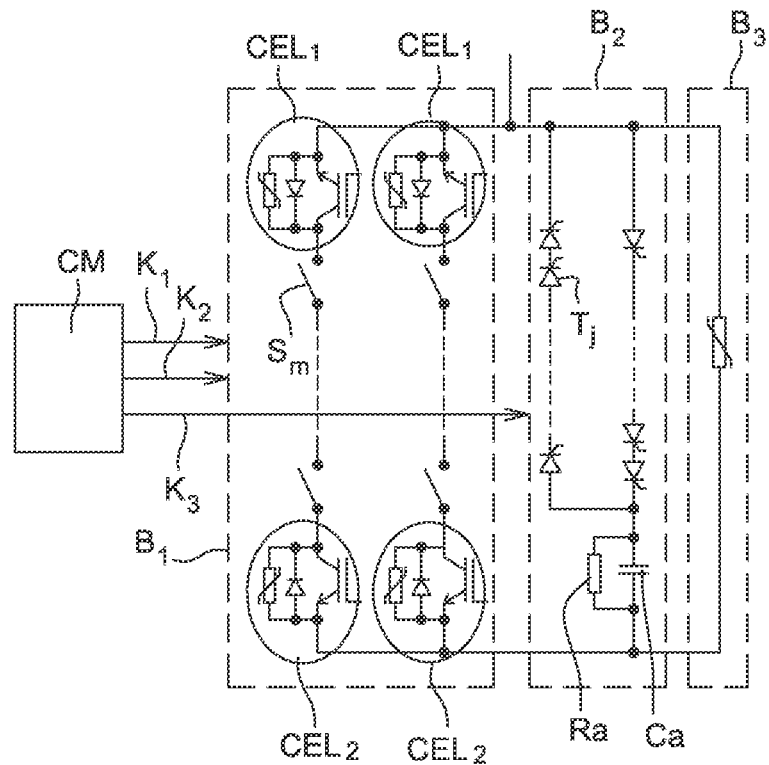
FIGS. 1A and 1B show a first variant of a breaker device in a first embodiment of the invention.
Figure 1B:
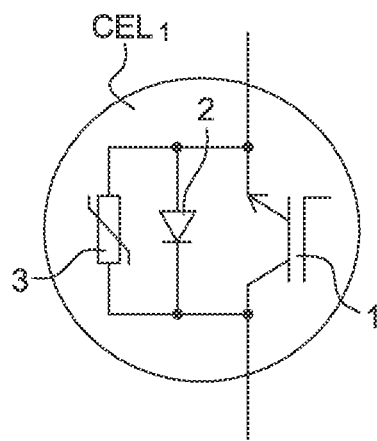

FIGS. 1A and 1B show a first variant of a breaker device in the first embodiment of the invention.

FIG. 1A shows the essential electrical elements that constitute the breaker device in its entirety, and FIG. 1B shows a view of a detail of one of the elements shown in FIG. 1A.

The breaker device comprises three branches in parallel $B_1$, $B_2$, $B_3$ and a control circuit CM. The branches are composed of a main branch $B_1$ in which the current to be interrupted flows, an auxiliary branch $B_2$, and a branch $B_3$ that is constituted by a lightning arrester.

By way of non-limiting example, the main branch $B_1$ comprises two parallel sub-branches, each sub-branch comprising at least one mechanical interrupter/disconnector $S_m$ and two semi-conductor breaker cells $CEL_1$, $CEL_2$. Preferably, each breaker cell $CEL_i$ (i=1, 2) is placed at a respective end of the sub-branch, and the mechanical disconnector(s) is/are placed between the breaker cells. By way of example, each semi-conductor breaker cell $CEL_i$ (i=1, 2) comprises an insulated-gate bipolar transistor (IGBT) 1, a diode 2, and a voltage limiter 3 (cf. FIG. 1B). The diode 2 is connected in anti-parallel with the transistor 1, and the voltage limiter 3 is connected in parallel with the transistor 1. The breaker cells $CEL_1$, $CEL_2$ are connected to conduct in opposite directions on opposite sides of the mechanical interrupters/disconnectors $S_m$.

In the embodiment shown in FIG. 1A, the main branch comprises two sub-branches. More generally however, the main branch may be constituted by only a single branch or it may comprise N parallel sub-branches (N≥2).

The auxiliary branch $B_2$ comprises at least one capacitor Ca in parallel with at least one resistor Ra, and at least two sub-assemblies of thyristors $T_j$ in cascade. The two sub-assemblies of thyristors are connected in anti-parallel. The assembly that is constituted by the resistor Ra and the capacitor Ca is connected in series with the two sub-assemblies of thyristors. In manner known per se, each thyristor of the auxiliary branch includes control electronics (not shown in the figures) that are connected in parallel with the thyristor. The control electronics comprise storage capacitors that participate in the process of controlling the thyristors.

The auxiliary branch $B_2$ shown in FIG. 1A is one embodiment of an auxiliary branch. Other embodiments of the auxiliary branch $B_2$ are given below with reference to FIGS. 8A-8D.

The breaker device in the first variant of the first embodiment of the invention that is shown in FIGS. 1A and 1B is advantageously suitable for conducting DC or AC. The presence of the diodes in the main branch and of the components connected in anti-parallel in the main and auxiliary branches specifically makes it possible to conduct DC flowing in one direction or the other, or to conduct AC with half-cycles in opposite directions. In the desired application, the person skilled in the art will consequently assess whether it is necessary to maintain the presence of diodes and of components connected in anti-parallel.

The operation of the device shown in FIGS. 1A-1B are described below with reference to FIGS. 5A-5C.

FIGS. 5A-5C show the current-interrupting process when the appearance of a fault causes the current $I_1$ passing through the main branch to increase to a threshold value $I_0$, the detection of which triggers breaking. More generally, the person skilled in the art will understand that the breaking process may be triggered at any time, whenever a trigger instruction is given, even without the appearance of a fault, and regardless of the value of the current.

In normal operation, the IGBTs 1 conduct: the current $I_1$ to be interrupted passes via the main branch $B_1$, and neither the auxiliary branch $B_2$ nor the lightning arrester (branch $B_3$) is conducting. In the following description of the first embodiment of the invention, the current flowing in the IGBTs of the main branch is referenced $I_1$, and the current flowing in the voltage limiters is referenced $I_3$.

At an instant $t_0$, the current $I_1$ reaches a value $I_0$ and the control circuit CM sends a simultaneous opening command $K_1$ to all of the mechanical interrupters/disconnectors $S_m$. At an instant $t_1$ that is after $t_0$, the control circuit CM then sends a simultaneous opening command $K_2$ to all of the IGBTs. The time difference between the instant $t_1$ and the instant $t_0$ is selected as a function of the current to be interrupted. The greater the current to be interrupted, the longer the time period between the instant $t_1$ and the instant $t_0$ for a same capacitance of the capacitor Ca. By way of non-limiting example, an embodiment of the invention is such that, for the capacitor Ca having capacitance equal to 34 microfarads (μF) and for a peak value of the current to be interrupted equal to 8 kiloamperes (kA), the time difference between the instant $t_1$ and the instant $t_0$ is equal to 250 microseconds (μs).

From a theoretical point of view, the instants $t_0$ and $t_1$ could coincide. However, in such circumstances, the capacitance of the capacitor Ca would reach values that are too high.

From the instant $t_1$, the current $I_1$ in the IGBTs decreases until it is zero, and the current $I_3$ passing through the voltage limiters 3 increases until it reaches a maximum current value $I_{max3}$ that is equal to the current that is flowing in the transmission line (cf. FIG. 5B).

At an instant $t_2$ that is after or at the instant at which the current flowing in the voltage limiter(s) reaches the value of the current that is flowing in the transmission line, all of the thyristors of the auxiliary branch are put into the conductive state by means of a command $K_3$ delivered by the control circuit CM. The storage capacitors connected in parallel with the thyristors of the auxiliary branch charge during the time interval $\Delta t$ between the instant $t_2$ and the instant $t_1$.

A current $I_{aux}$ thus passes through the thyristors of the auxiliary branch (cf. FIG. 5C). The current $I_{aux}$ increases. At an instant $t_3$ that is after the instant $t_2$, the mechanical interrupters/disconnectors $S_m$ are in the electrically-open state.

The time period between the instant $t_1$, at which the order is given to the mechanical interrupters/disconnectors to open, and the instant $t_3$ is a characteristic specific to the mechanical interrupters/disconnectors. Two scenarios are thus possible, depending on whether the instant $t_2$ is before or after the instant $t_3$.

When the instant $t_2$ is before the instant $t_3$ (as shown in FIGS. 5A-5C), the thyristors are closed before the mechanical interrupters/disconnectors $S_m$ are placed in the electrically-open state. An increasing current thus flows in the auxiliary branch. The capacitor Ca charges and the voltage increases across its terminals. The presence of the capacitor makes it possible to time the rise in voltage across the terminals of the lightning arrester (for this purpose its capacitance is selected as a function of the value of the current of the main branch that it is desired to interrupt). At instant $t_4$, the voltage across the terminals of the lightning arrester reaches the conduction voltage of the lightning arrester, the lightning arrester begins to conduct and the current $I_{para}$ passing through the lightning arrester increases, thus causing the current in the auxiliary branch to drop. Subsequently, in manner known per se, the current in the lightning arrester stabilizes and decreases until it becomes zero, and the voltage across the terminals of the main branch stabilizes at the network voltage.

When the instant $t_2$ is after the instant $t_3$, the thyristors are closed after the mechanical interrupters/disconnectors are placed in the electrically-open state. The capacitance of the capacitor Ca may thus advantageously be selected to be less than the capacitance that is selected for when the instant $t_2$ is before the instant $t_3$.

In an improvement of the invention, the breaking process is preceded by a preliminary test of the thyristors of the auxiliary branch.

The test is performed as follows. At an instant $t_0-\delta t$ that precedes the instant $t_0$, the time period $\delta t$ possibly being equal to a few microseconds for example, an opening command is applied to the IGBTs. Opening the IGBTs causes a voltage to appear across the terminals of each IGBT. The voltage is thus applied across the terminals of the storage capacitors that are in parallel with the thyristors of the auxiliary branch. This results in the storage capacitors charging progressively. The charge of the storage capacitors is then measured, and if it is found that charging is performed correctly (i.e. the voltage across the terminals of the storage capacitors reaches a predetermined threshold value in a required time), the thyristors of the auxiliary branch are considered as being in working order. The order to open the mechanical interrupters/disconnectors is sent at the instant $t_0$, as indicated above.

However, if the storage capacitors are not charged correctly (i.e. the voltage across the terminals of the storage capacitors does not reach a predetermined threshold value in a required time), the thyristors of the auxiliary branch are not considered as being in working order and no opening order is sent to the mechanical interrupters/disconnectors.

Figure 2:
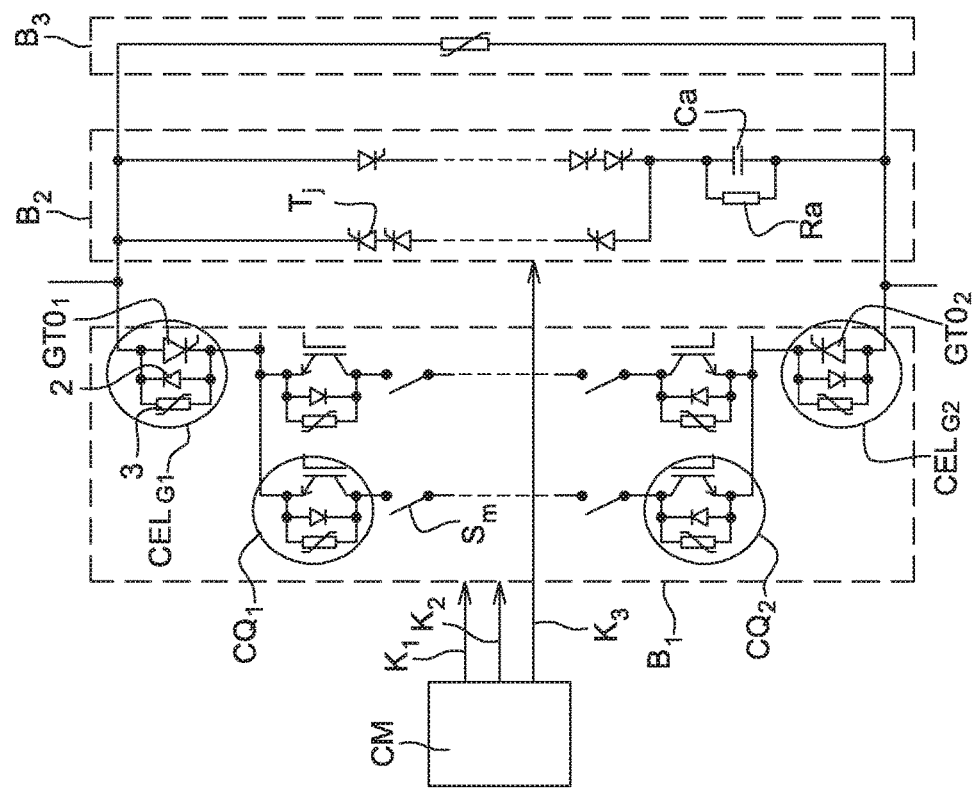
FIG. 2 shows a second variant of a breaker device in the first embodiment of the invention.

FIG. 2 shows a second variant of a breaker device in the first embodiment of the invention.

By way of non-limiting example, the main branch includes two breaker cells $CEL_{G1}$, $CEL_{G2}$ with gate turn-off (GTO) thyristors.

Each GTO thyristor breaker cell $CEL_{Gi}$ (i=1, 2) comprises at least a GTO thyristor $GTO_i$, a diode 2, and a voltage limiter 3. The diode 2 is connected in anti-parallel with the thyristor $GTO_i$. Each cell $CEL_{Gi}$ (i=1, 2) is preferably placed at an end of the main branch. The two cells $CEL_{G1}$ and $CEL_{G2}$ are connected to conduct in opposite directions at opposite ends of a plurality of parallel sub-branches, each sub-branch comprising at least one mechanical interrupter/disconnector $S_m$ and two current-balancing cells $CQ_i$ connected to conduct in opposite directions, each current-balancing cell being at a respective end of its sub-branch.

The current-balancing cells $CQ_i$ (i=1, 2) comprise the same components as the breaker cells $CEL_i$ (i=1, 2) of the above-described first variant. However, in this variant, the IGBTs that form parts of the balancing cells are not used for interrupting current, but are used for the sole purpose of balancing the current flowing in the various parallel sub-branches of the main branch.

The remarks relating to the flow of DC and AC made above with reference to the breaker device of the first variant, also apply for the breaker device of the second variant.

The same applies for the breaking process shown in FIGS. 5A-5C that also applies to the device shown in FIG. 2.

Thus, the control circuit CM successively delivers a command $K_1$ for opening the mechanical interrupters/disconnectors at an instant $t_0$, a command $K_2$ for opening the GTO thyristors of the main branch at an instant $t_1$, and a command $K_3$ for closing the thyristors of the auxiliary branch at an instant $t_2$.

Figure 3:
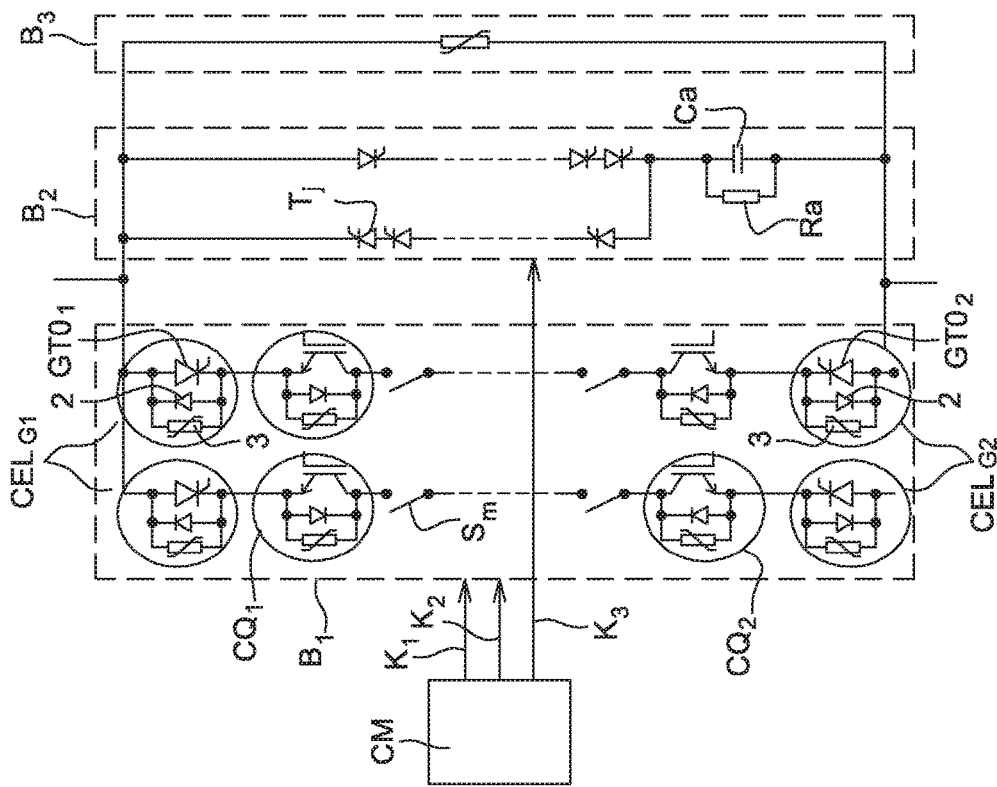
FIG. 3 shows a third variant of a breaker device in the first embodiment of the invention.

FIG. 3 shows a third variant of a breaker device in the first embodiment of the invention.

By way of non-limiting example, the main branch $B_1$ comprises two parallel sub-branches, each sub-branch comprising at least one mechanical interrupter/disconnector $S_m$ and two GTO thyristor breaker cells $CEL_{G1}$ and $CEL_{G2}$ connected to conduct in opposite directions on opposite sides of the mechanical interrupters/disconnectors $S_m$. Preferably, each breaker cell $CEL_{Gi}$ (i=1, 2) is placed at a respective end of the sub-branch, and the mechanical disconnector(s) is/are placed between the breaker cells. Each breaker cell $CEL_{Gi}$ (i=1, 2) comprises at least one GTO thyristor $GTO_i$, a diode 2, and a voltage limiter 3. The diode 2 is connected in anti-parallel with the GTO thyristor(s), and the voltage limiter 3 is connected in parallel with the diode 2.

Current-balancing cells $CQ_i$ (i=1, 2) are placed between the breaker cells $CEL_{Gi}$ (i=1, 2) and the mechanical interrupters/disconnectors $S_m$. Each current-balancing cell includes an IGBT that does not intervene in the breaking process.

In the variant shown in FIG. 3, the main branch comprises two sub-branches. More generally however, in this variant of the invention, the main branch contains N parallel sub-branches (N≥2).

The remarks relating to the flow of DC and AC made above with reference to the breaker device of the first variant, also apply for the breaker device of the third variant.

As above, the operation of the breaking process implemented by the device shown in FIG. 3 is shown in FIGS. 5A-5C. Thus, the control circuit CM successively delivers a command $K_1$ for opening the mechanical interrupters/disconnectors at an instant $t_0$, a command $K_2$ for opening the GTO thyristors of the main branch at an instant $t_1$, and a command $K_3$ for closing the thyristors of the auxiliary branch at an instant $t_2$.

Figure 4:
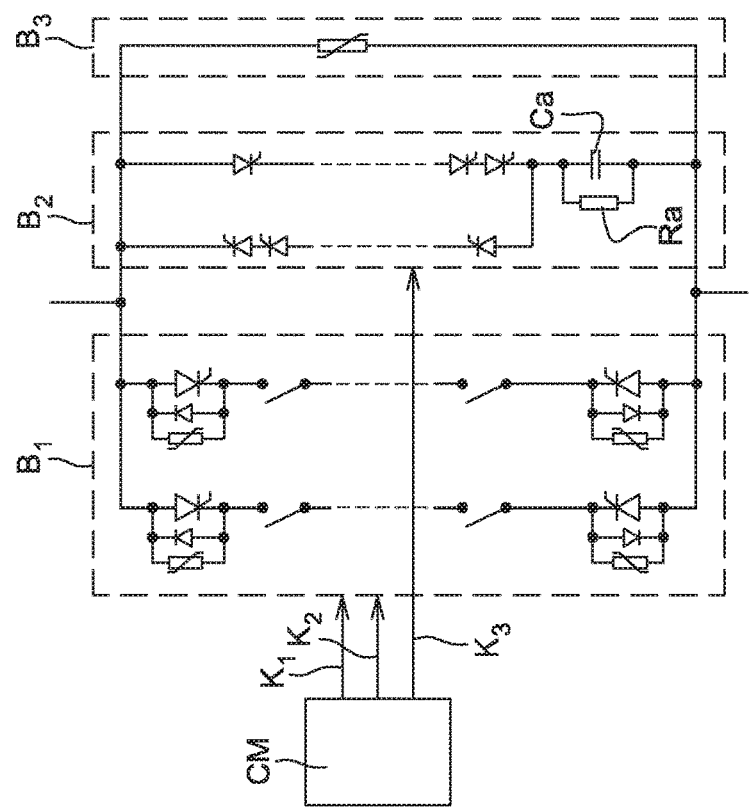
FIG. 4 shows a fourth variant of a breaker device in the first embodiment of the invention.

FIG. 4 shows a fourth variant of a breaker device in the first embodiment of the invention.

The fourth variant generally corresponds to the first variant, the only difference being that the IGBTs of the device of the first variant are replaced in this variant by GTO thyristors.

The operation of the breaking process implemented by the device shown in FIG. 4 is also illustrated by means of FIGS. 5A-5C. Thus, the control circuit CM successively delivers a command $K_1$ for simultaneously opening the mechanical interrupters/disconnectors at an instant $t_0$, a command $K_2$ for simultaneously opening the GTO thyristors of the main branch at an instant $t_1$, and a command $K_3$ for simultaneously closing the thyristors of the auxiliary branch at an instant $t_2$. The above remarks relating to DC and AC also apply for the fourth variant of the breaker device.

Figure 6:
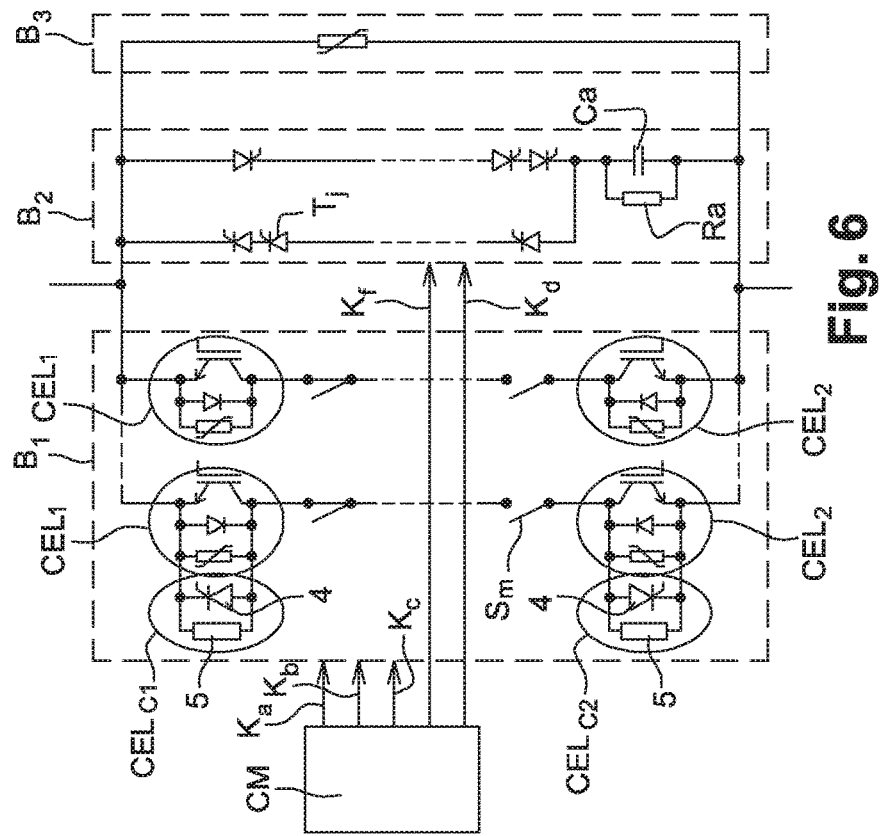
FIG. 6 shows a breaker device in a second embodiment of the invention.

FIG. 6 shows a breaker device in a second embodiment of the invention.

The second embodiment of the invention corresponds to an improvement of the first variant of the first embodiment.

In certain applications, the breaking capacity of IGBTs is not sufficient. In order to deal with this insufficiency, the second embodiment of the invention makes provision for the presence of at least one additional breaker cell $CEL_{Ci}$ (i=1, 2) in parallel with at least one breaker cell provided with at least one IGBT, which additional breaker cell has breaking capacity that is greater than the breaking capacity of the initial breaker cell $CEL_i$ provided with the IGBT.

By way of example, a breaker cell $CEL_{Ci}$ (i=1, 2) is constituted by at least one GTO thyristor 4 connected in parallel with control electronics 5. In a first variant of the second embodiment of the invention, the control electronics 5 include at least one voltage limiter that is dimensioned so as to conduct the current for interrupting by the GTO thyristor 4. In a second variant of the second embodiment, the control electronics 5 do not include their own voltage limiter, and it is the voltage limiters of the cell $CEL_i$ that are dimensioned to conduct the current for interrupting by the GTO thyristor 4.

FIGS. 7A-7D show the process for interrupting current flowing in the main branch in the second embodiment of the invention. In the following description of the second embodiment of the invention, the current flowing in the IGBTs of the main branch is referenced $I_1$, and the current flowing in the voltage limiters is referenced $I_3$ or $I_5$.

As mentioned above with reference to FIGS. 5A-5C, the current-interrupting process shown in FIGS. 7A-7D corresponds to when the appearance of a fault causes the current $I_1$ flowing in the IGBTs to increase to a threshold value $I_0$, the detection of which triggers breaking. More generally however, the breaking process may be triggered at any time, whenever a trigger instruction is given, even without the appearance of a fault, and regardless of the value of the current that is passing through the IGBTs.

When, at an instant $t_a$, the current $I_1$ reaches a predetermined value $I_0$, an opening command $K_a$ is sent by the control circuit CM to all of the IGBTs. The current in the IGBTs decreases until it is zero, and the current $I_3$ in the voltage limiter(s) in parallel with the IGBTs increases until it reaches a maximum value $I_{max3}$.

At an instant $t_b$ that is after $t_a$, an opening command $K_b$ is sent to all of the mechanical interrupters/disconnectors $S_m$, and a closing command $K_c$ is sent simultaneously to the GTO thyristors 4. The GTO thyristors 4 thus become conductive. Then, at an instant $t_c$ that is after $t_b$, an opening command $K_d$ is sent to the GTO thyristors 4. The current $I_{GTO}$ in the thyristors 4 decreases until it is zero, and a current $I_5$ increases in the voltage limiter(s) until it reaches the value of the current $I_{max3}$ that is flowing in the transmission line.

At an instant $t_d$ that is after or at the instant at which the current flowing in the voltage limiter(s) reaches the value of the current that is flowing in the transmission line, a command $K_e$ delivered by the control circuit CM puts all of the thyristors of the auxiliary branch into the conductive state.

The storage capacitors connected in parallel with the thyristors of the auxiliary branch charge during the time interval $\Delta t$ between the instant $t_d$ and the instant $t_c$.

A current $I_{aux}$ thus passes through the thyristors of the auxiliary branch. At an instant $t_e$ that is after the instant $t_d$, the mechanical interrupters/disconnectors $S_m$ are in the electrically-open state.

The time period between the instant $t_b$, at which the order is given to the mechanical interrupters/disconnectors to open, and the instant $t_e$ is a characteristic specific to the mechanical interrupters/disconnectors. Two scenarios are thus possible, depending on whether the instant $t_d$ is before or after the instant $t_e$.

When the instant $t_d$ is before the instant $t_e$, the thyristors of the auxiliary branch are closed before the mechanical interrupters/disconnectors are placed in the electrically-open state. An increasing current thus flows in the auxiliary branch. The capacitor Ca charges and the voltage increases across its terminals. The presence of the capacitor makes it possible to time the rise in voltage across the terminals of the lightning arrester (for this purpose, its capacitance is selected as a function of the value of the current of the main branch that it is desired to interrupt). At instant $t_f$, the voltage across the terminals of the lightning arrester reaches the conduction voltage of the lightning arrester, the lightning arrester begins to conduct and the current $I_{para}$ passing through the lightning arrester increases, thus causing the current in the auxiliary branch to drop. Subsequently, in manner known per se, the current in the lightning arrester stabilizes and decreases until it becomes zero, and the voltage across the terminals of the main branch stabilizes at the network voltage.

When the instant $t_d$ is after the instant $t_e$, the thyristors are closed after the mechanical interrupters/disconnectors are placed in the electrically-open state. The capacitance of the capacitor Ca may thus advantageously be selected to be less than the value that is selected when the instant $t_d$ is before $t_e$. The later $t_d$, the smaller the capacitance of Ca.

In the second embodiment of the invention, it is possible to perform the preliminary test of the thyristors of the auxiliary branch between the instants $t_a$ and $t_b$. The time period between the instants $t_a$ and $t_b$ is typically equal to at least 10 µs, which is a sufficient time period for performing the test. At the instant $t_a$ in which the IGBTs are opened under the effect of the command $K_a$, a voltage is created across the terminals of the IGBTs, which voltage charges the storage capacitors connected in parallel with the thyristors of the auxiliary branch. The charge is then measured. If the storage capacitors are charging normally, the process continues, with the cells $CEL_{Ci}$ (i=1, 2) being put into a conductive state. If not, the process is interrupted.

In the above-mentioned embodiments of the invention, The semi-conductor element of each breaker cell $CEL_1$ is an IGBT or a GTO thyristor. The invention also relates to the scenario in which the semi-conductor element of each breaker cells $CEL_1$ is a silicon thyristor or a silicon carbide thyristor or a gallium nitride thyristor, for example. Such a thyristor advantageously presents a very low voltage across its terminals when it is conductive (thyristor closed). Its use thus guarantees very low consumption. Another advantage of silicon carbide or gallium nitride thyristors is that they may guarantee a high opening/closing frequency that contributes to accelerating the process of interrupting current.

In order to obtain the same advantages as those mentioned above (low consumption, high speed), the thyristors of the auxiliary branch may also be silicon thyristors and/or silicon carbide thyristors and/or gallium nitride thyristors.

By way of non-limiting example, FIGS. 8A-8D show various auxiliary branch variants that are compatible with various embodiments of the invention.

With reference to FIG. 8A, the branch $B_2$ comprises a first branch and a second branch that are connected in parallel. The first branch is constituted by a first sub-assembly of thyristors Tj that are electrically connected in series with at least one capacitor Ca, itself connected in parallel with at least one resistor Ra, and the second branch is constituted by a second sub-assembly of thyristors Tj that are electrically connected in series with at least one other capacitor Ca, itself connected in parallel with at least one other resistor Ra. The thyristors of the second sub-assembly of thyristors are connected in anti-parallel with the thyristors of the first sub-assembly. Each sub-assembly of thyristors Tj comprises at least one thyristor.

With reference to FIG. 8B, the branch $B_2$ is constituted by at least one sub-assembly $E_1$ in accordance with the branch $B_2$ of FIG. 8A taken in its entirety.

With reference to FIG. 8C, the branch $B_2$ is constituted by at least one sub-assembly $E_2$ in accordance with the branch $B_2$ of FIG. 1A taken in its entirety.

With reference to FIG. 8D, the branch $B_2$ is constituted by at least one sub-assembly $E_3$ that is constituted by at least one triac TR connected in series with at least one assembly that is constituted by at least one resistor Ra connected in parallel with at least one capacitor Ca.

What is claimed is:

1. A breaker device for interrupting current flowing on a transmission line, the device comprising three electrical branches connected in parallel: a main branch ($B_1$) in which the current to be interrupted flows; an auxiliary branch ($B_2$); and a voltage limiter branch ($B_3$); the main branch comprising at least one semi-conductor breaker cell ($CEL_1$, $CEL_{G1}$) connected in series with at least one mechanical interrupter/disconnector ($S_m$), the semi-conductor breaker cell ($CEL_1$, $CEL_{C1}$) including at least one semi-conductor element (1, 4) configured to be commanded to open or close and that is connected in parallel with a voltage limiter (5, 3), the auxiliary branch ($B_2$) comprising at least one assembly that is constituted by at least one capacitor (Ca) connected in parallel with at least one resistor (Ra), said assembly being connected in series with at least one thyristor, the device further comprising a control circuit (CM) configured to command opening of the semi-conductor element of the semi-conductor breaker cell ($CEL_1$, $CEL_{G1}$) and opening of the mechanical interrupter/disconnector ($S_m$), the control circuit (CM) further configured to act, once the current is interrupted in the semi-conductor element of the semi-conductor breaker cell, to command the thyristor of the auxiliary branch ($B_2$) to be put into a conductive state at an instant that is after or at the instant at which the current flowing in the voltage limiter(s) reaches the value of the current ($I_1$) that is flowing in the transmission line.

2. The breaker device according to claim 1, for interrupting current on the transmission line, wherein the control circuit (CM) is further configured to:
   apply an opening command ($K_1$) to the mechanical interrupter/disconnector ($S_m$) at an instant $t_0$;
   apply an opening command ($K_2$) to the semi-conductor element of the semi-conductor breaker cell at an instant $t_1$ that is after the instant $t_0$, such that a current passing through said semi-conductor element decreases until it is zero, and such that a current passing through the voltage limiter(s) increases until it reaches the value of the current that is flowing in the transmission line; and
   apply a command for putting the thyristor of the auxiliary branch in a conductive state at an instant $t_2$ that is after or at the instant at which the current flowing in the voltage limiter(s) reaches the value of the current ($I_1$) that is flowing in the transmission line.

3. The breaker device according to claim 2, wherein, when the main branch ($B_1$) comprises at least two parallel sub-branches, each sub-branch includes at least one current-balancing cell configured to balance the current between the various parallel sub-branches.

4. The breaker device according to claim 3, wherein a current-balancing cell is constituted by a semi-conductor element configured to conduct the current and being connected in parallel with a voltage limiting circuit.

5. The breaker device according to claim 4, wherein the semi-conductor element is an IGBT.

6. The breaker device according to claim 2, wherein each semi-conductor breaker cell is connected in series with at least two sub-branches, each sub-branch comprising at least one mechanical interrupter/disconnector and/or at least one current-balancing cell configured to balance the currents between the sub-branches.

7. The breaker device according to claim 2, wherein the control circuit (CM) is further configured to:
- at an instant that precedes the instant $t_0$, apply a preliminary opening command to the semi-conductor element of the breaker cell of the main branch;
- when the preliminary opening command is applied to the semi-conductor element of the breaker cell of the main branch, measure charge in storage capacitors connected in parallel with the thyristor of the auxiliary branch; and
- allow the opening command to be applied to the mechanical interrupter/disconnector ($S_m$) at the instant $t_0$, if a measurement of the charge of the storage capacitors matches a predetermined charge value.

8. The breaker device according to claim 2, wherein the semi-conductor element is an IGBT.

9. The breaker device according to claim 2, wherein the semi-conductor element is a GTO thyristor.

10. The breaker device according to claim 2, wherein the semi-conductor element is a silicon thyristor or a silicon carbide thyristor or a gallium nitride thyristor.

11. The breaker device according to claim 1, wherein the main branch ($B_1$) includes at least one additional semi-conductor breaker cell ($CEL_{C1}$) that is placed in parallel with the semi-conductor breaker cell ($CEL_1$), said additional semi-conductor breaker cell ($CEL_{C1}$) having breaking capacity that is greater than the breaking capacity of the semi-conductor breaker cell ($CEL_1$).

12. The breaker device according to claim 11, wherein the additional semi-conductor breaker cell ($CEL_{C1}$) includes at least one voltage limiter (5) connected in parallel with the voltage limiter of the semi-conductor breaker cell ($CEL_1$).

13. The breaker device according to claim 11, wherein the control circuit (CM) is further configured to:
- apply an opening command ($K_a$) to the semi-conductor element of the semi-conductor breaker cell at an instant $t_a$;
- apply an opening command ($K_b$) to the mechanical interrupter/disconnector ($S_m$) and a closing command ($K_c$) to the semi-conductor element of the additional semi-conductor breaker cell ($CEL_{C1}$) at an instant $t_b$ that is after the instant $t_a$, such that the semi-conductor element of the additional semi-conductor breaker cell becomes conductive;
- apply an opening command ($K_d$) to the semi-conductor element of the additional semi-conductor breaker cell at an instant $t_c$ that is after the instant $t_b$, such that a current passing through the semi-conductor element of the additional semi-conductor breaker cell decreases until it is zero, and such that a current passing through the voltage limiter(s) increases until it reaches the value of the current that is flowing in the transmission line; and
- apply a command ($K_e$) for putting the thyristor of the auxiliary branch in a conductive state at an instant $t_d$ that is after or at the instant at which the current flowing in the voltage limiter(s) reaches the value of the current ($I_1$) that is flowing in the transmission line.

14. The breaker device according to claim 11, wherein the control circuit (CM) is further configured to apply a preliminary opening command to the semi-conductor element of the breaker cell of the main branch at the instant $t_a$, and:
- to act when the preliminary opening command is applied to the semi-conductor element of the breaker cell of the main branch to measure charge in storage capacitors connected in parallel with the thyristor of the auxiliary branch; and
- to allow the opening command to be applied to the mechanical interrupter/disconnector ($S_m$), if a measurement of the charge of the storage capacitors matches a predetermined charge value.

15. The breaker device according to claim 11, wherein the semi-conductor element of the additional semi-conductor breaker cell is a GTO thyristor.

16. The breaker device according to claim 11, wherein the semi-conductor element of the additional semi-conductor breaker cell is a silicon thyristor or a silicon carbide thyristor or a gallium nitride thyristor.

17. The breaker device according to claim 15, wherein the semi-conductor element of the semi-conductor breaker cell is an IGBT.

18. The breaker device according to claim 11, wherein the thyristor of the auxiliary branch is a silicon thyristor or a silicon carbide thyristor or a gallium nitride thyristor.

* * * * *